310-369 SR
5/13/86 XR 4,588,999

United States Patent [19]

Depta et al.

[11] Patent Number: 4,588,999

[45] Date of Patent: May 13, 1986

[54] DEVICE FOR THE FIXING AND CONTACTING OF PIEZOTUBES

[75] Inventors: Ingolf Depta, Petershausen; Wilfried Kindler, Munich, both of Fed. Rep. of Germany

[73] Assignee: Siemens Aktiengesellschaft, Berlin and Munich, Fed. Rep. of Germany

[21] Appl. No.: 718,613

[22] Filed: Apr. 1, 1985

[30] Foreign Application Priority Data

May 18, 1984 [DE] Fed. Rep. of Germany ....... 3418636

[51] Int. Cl.[4] ....................... G01D 15/18; H01L 41/08

[52] U.S. Cl. ................................ 346/140 R; 310/369

[58] Field of Search .................. 346/140 PD; 310/369

[56] References Cited

U.S. PATENT DOCUMENTS 4,288,799 9/1981 Uzawa et al. ................ 346/140 PD
4,368,477 1/1983 Heinzl et al. ................. 346/140 PD
4,502,059 2/1985 Blessington .................. 346/140 PD
4,504,845 3/1985 Kattner et al. .

*Primary Examiner*—George H. Miller, Jr.
*Attorney, Agent, or Firm*—Thomas H. Jackson

[57] ABSTRACT

For the contacting and for the fixing of tubular piezo-elements or, more particularly, piezotubes, in the recording head of an ink printer, a tube holder, first contact elements, a clamping part into which the tube holder can be snapped, and second contact elements are disclosed. The tube carrier has cut-outs corresponding to the form and position of the piezotubes, into which the first contact elements can be placed. The clamping part has openings, into which the second contact elements are inserted. After the tube carrier has been snapped into place, the first and second contact elements, being held in correct position, are soldered.

4 Claims, 1 Drawing Figure

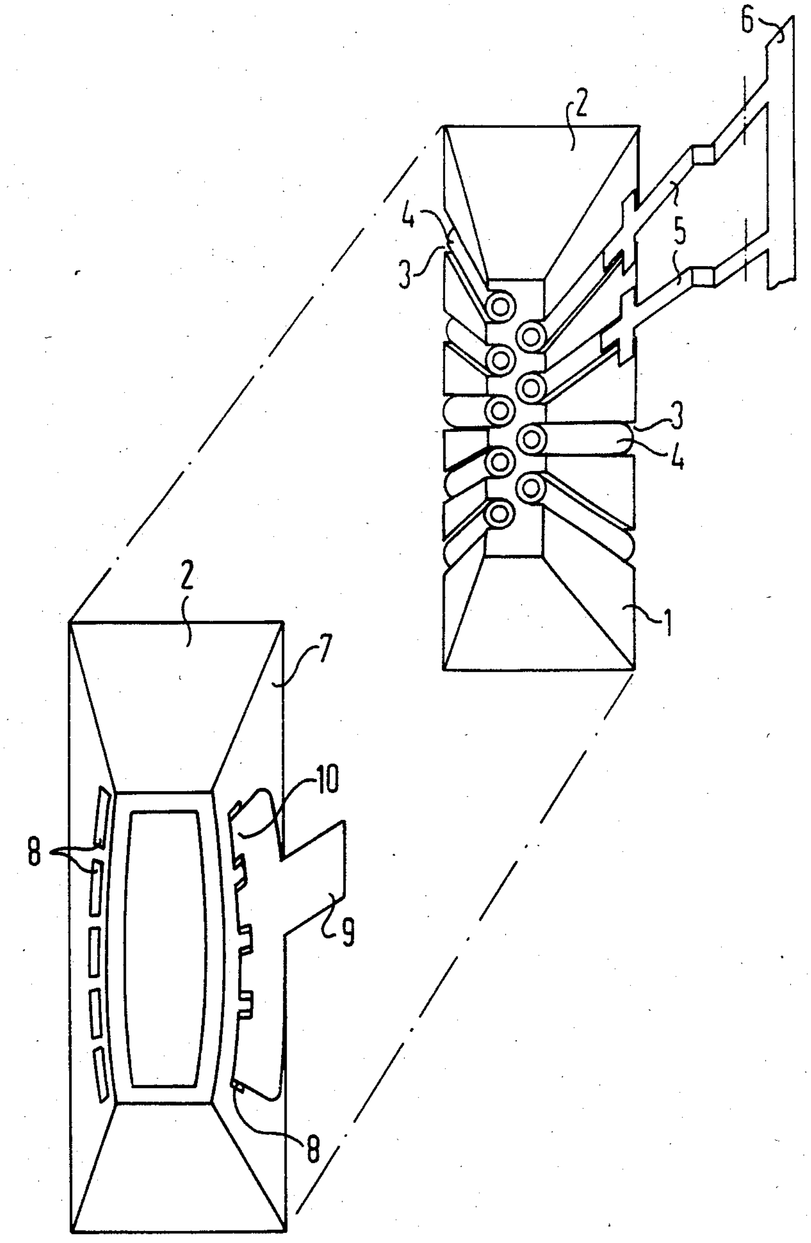
6
2
4
3
5
3
4
1
2
7
10
8
9
8

DEVICE FOR THE FIXING AND CONTACTING OF PIEZOTUBES

BACKGROUND OF THE INVENTION

1. Technical Field

The invention relates to the field of ink jet printers and more particularly to a device for fixing and contacting of drive elements in the form of piezotubes of ink jet printers.

2. Description of the Prior Art

The production of recording heads for ink jet printers, in which a plurality of ink ducts extend between an ink supply part and the end of the recording head toward a record support, is performed, as is known, in a so-called pouring process. The procedure in practice is to place in a mold part so-called mold needles, on each of which a drive element for the droplet ejection in the form of a so-called piezotube of piezoceramic material is fitted. For the contacting of the piezotubes, contact clamps may be provided, which hold at the same time also the piezotubes. The unit thus preassembled is then sealed. After the mold has hardened, the mold needles are pulled out. The resulting cavities from the ink ducts in the interior of the recording head.

A problem with known production methods is the exact positioning and fixing of the piezotubes in the mold part. Because of the very small dimensions of the parts used and because of the stringent requirements of exact adjustment, a high degree of manual skill is required for the production of ink recording heads. In addition, the contacting of the piezotubes, provided with an outer and an inner electrode, must be fully ensured before the actual sealing.

SUMMARY OF THE INVENTION

It is the object of the present invention then to simplify the fixing and contacting of the piezotubes and thus reduce the expense connected with the production of recording heads of the above-mentioned kind.

The problems exhibited in the field are solved by providing a snap-in tube carrier with cut-outs adapted to the piezotubes in the printer head for receiving first contact elements and the piezotubes. A clamping part is provided for receiving the snap-in tube carrier and for plugging in second contact elements. More particular features of the invention are given with reference to an embodiment illustrated in the drawing.

BRIEF DESCRIPTION OF THE DRAWING

The FIGURE shows a perspective exploded view of a device for fixing and contacting of piezotubes.

DETAILED DESCRIPTION

In the top part of the drawing, a plastic part 1 is shown, which because of its function is hereinafter called a tube carrier. In the bottom part of the drawing, a clamping part 2 is shown, into which the tube carrier 1 can be snapped. The tube carrier 1 has in the example nine cut-outs 3, which in their form are adapted to the form of the piezotubes, marked 4, and which serve as seating for the piezotubes 4. The cut-outs 3 are arranged in accordance with the arrangements of the piezotubes 4 in the recording head. First contact elements 5 are provided for the individualk contacting of the various piezotubes 4. The first contact elements 5 may be provided as single contacts or, as shown in the embodiment, as contact banks 6. In that case the contact studs of a contact bank form the respective contact elements 5, which are inserted into the corresponding cut-outs 3 of the tube carrier 1. If, as shown in the embodiment, the cut-outs 3 are provided on both sides of the tube carrier 1, such a contact bank exists for each row of cut-outs. The contact elements 5 extend into the cut-outs 3 far enough that through them contact with one, preferably with the outer, electrode of each piezotube 4 is ensured.

The clamping part 2 shown in the lower portion of the drawing serves to receive the tube carrier 1 which after insertion of the first contact elements is pressed into the clamping part 2 and secured by snapping in. In the region of the cut-outs 3 of the snapped-in tube carrier 1, the clamping part 2 has in its lateral long walls 7 openings 8. The openings 8 serve to receive the second contact elements 9. Also the second contact elements are formed as contact banks, the contact studs 10 of the contact element 9 being passed through the openings 8 before the snapping in of the tube carrier 1. The contact studs 10 are dimensioned so that through them contact with the inner electrode of each piezotube is ensured. The clamping part 2 insulates the contacting of the piezotubes by the second contact elements from the contacting by the first contact elements.

After snapping in of the tube carrier 1 into the clamping part 2, whereby the first and second contact elements are held clamped, the contact studs 5 of the contact bank 6 are singled by cutting. This ensures the single contacting of the piezotubes required for a recording head of the above-mentioned kind. The connection, common to all piezotubes, with the respective other electrode of the piezotubes can then occur through the contact studs 10 of the second contact bank 9.

The holding part thus formed by the insertion of the actual tube carrier 1 into the clamping part is fitted, preferably before being equipped with the various piezotubes, on a circuitboard and wave-soldered. Thereafter the piezotubes 4 are inserted, being securely contacted through the contact studs 5 and 10. The holding part equipped with the piezotubes is thereafter placed in a mold and is sealed after the initially mentioned mold needles have been passed through the piezotubes. The position of the mold needles is largely secured by the clearly fixed position of the piezotubes already completely contacted.

The tube carrier 1 and the clamping part 2 consist of a temperature-resistant inexpensive plastic. The entire holding part consisting of these two parts can thus be sealed without a problem and remains a component part of the recording head.

What is claimed is:

1. A device for the fixing and contacting of drive elements in the form of piezotubes in the poured recording head of ink printing means comprising a tube carrier having first contact elements, the tube carrier having cut-outs which in their form and position are adapted to the piezotubes in the recording head, the cut-outs for receiving the first contact elements and the piezotubes, and a clamping part having associated second contact elements, the clamping part for receiving the tube carrier by a snapping-in, the clamping part having openings into which the second contact elements can be plugged.

2. A device according to claim 1, wherein the first and second contact elements are formed as contact banks having contact studs held in correct position after the tube carrier has been snapped into the clamping part, the contact studs of the first contact bank contacting an outer layer, and the contact studs of the second contact bank contacting an inner, layer of the piezotube.

3. A device according to claim 2, the contact studs of the first contact bank being singled after insertion into the tube carrier and snapping into the clamping part.

4. Device according to claims 1, 2, or 3, the tube carrier and the clamping part comprising temperature-resistant plastic.

* * * * *